United States Patent
Kim et al.

(10) Patent No.: US 9,257,485 B2
(45) Date of Patent: Feb. 9, 2016

(54) MEMORY DEVICE AND APPARATUS INCLUDING THE SAME

(71) Applicant: Samsung Electronics Co., Ltd., Suwon-Si, Gyeonggi-Do (KR)

(72) Inventors: Young-bae Kim, Seoul (KR); Kyung-min Kim, Goyang-si (KR); Sung-ho Kim, Yongin-si (KR); Seung-ryul Lee, Seoul (KR); Man Chang, Seoul (KR); Eun-ju Cho, Gyeongbuk (KR); Sae-jin Kim, Hwaseong-si (KR); Chang-jung Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/192,371

(22) Filed: Feb. 27, 2014

(65) Prior Publication Data
US 2014/0246643 A1  Sep. 4, 2014

(30) Foreign Application Priority Data

Mar. 4, 2013  (KR) .................. 10-2013-0022967

(51) Int. Cl.
*H01L 27/24*  (2006.01)
*H01L 45/00*  (2006.01)

(52) U.S. Cl.
CPC .......... *H01L 27/2481* (2013.01); *H01L 27/249* (2013.01); *H01L 27/2409* (2013.01); *H01L 27/2436* (2013.01); *H01L 45/04* (2013.01); *H01L 45/1226* (2013.01); *H01L 45/1233* (2013.01); *H01L 45/146* (2013.01)

(58) Field of Classification Search
CPC .................. H01L 27/2481; H01L 27/2436
USPC ........ 257/4, 324, E29.309, E21.409; 438/261
See application file for complete search history.

(56) References Cited

U.S. PATENT DOCUMENTS

| | | | |
|---|---|---|---|
| 6,593,176 | B2 | 7/2003 | Dennison |
| 6,930,913 | B2 | 8/2005 | Pellizzer et al. |
| 7,838,341 | B2 | 11/2010 | Dennison |
| 8,067,761 | B2 | 11/2011 | Dennison |

(Continued)

FOREIGN PATENT DOCUMENTS

| | | |
|---|---|---|
| JP | 2009266944 A | 11/2009 |
| KR | 20030063076 A | 7/2003 |

(Continued)

OTHER PUBLICATIONS

Kau, et al. "A stackable cross point phase change memory," *IEEE*, 2009.

*Primary Examiner* — Karen Kusumakar
*Assistant Examiner* — Adam S Bowen
(74) *Attorney, Agent, or Firm* — Harness, Dickey & Pierce, P.L.C.

(57) ABSTRACT

A memory device may include a first electrode and a second electrode spaced apart from the first electrode. The memory device may further include a memory element disposed between the first electrode and the second electrode and a switching element disposed between the first electrode and the second electrode. The switching element may be configured to control signal access to the memory element. The memory device may further include a barrier layer disposed between the memory element and the switching element, the barrier layer including an insulation material.

20 Claims, 8 Drawing Sheets

(56) References Cited

U.S. PATENT DOCUMENTS

| | | |
|---|---|---|
| 8,084,789 B2 | 12/2011 | Pellizzer et al. |
| 2007/0057341 A9 | 3/2007 | Pellizzer |
| 2010/0052042 A1 | 3/2010 | Tanaka et al. |
| 2010/0207185 A1 | 8/2010 | Lee et al. |
| 2010/0259960 A1 | 10/2010 | Samachisa |
| 2011/0007545 A1* | 1/2011 | Jin et al. .................. 365/148 |
| 2011/0272663 A1* | 11/2011 | An et al. ....................... 257/4 |
| 2013/0043452 A1* | 2/2013 | Meyer et al. ................. 257/4 |

FOREIGN PATENT DOCUMENTS

| | | |
|---|---|---|
| KR | 20100036520 A | 4/2010 |
| KR | 20100081618 A | 7/2010 |
| KR | 20110072025 A | 6/2011 |
| KR | 20110093309 A | 8/2011 |
| KR | 20110133926 A | 12/2011 |
| KR | 20120040018 A | 4/2012 |
| KR | 101167551 B1 | 7/2012 |

* cited by examiner

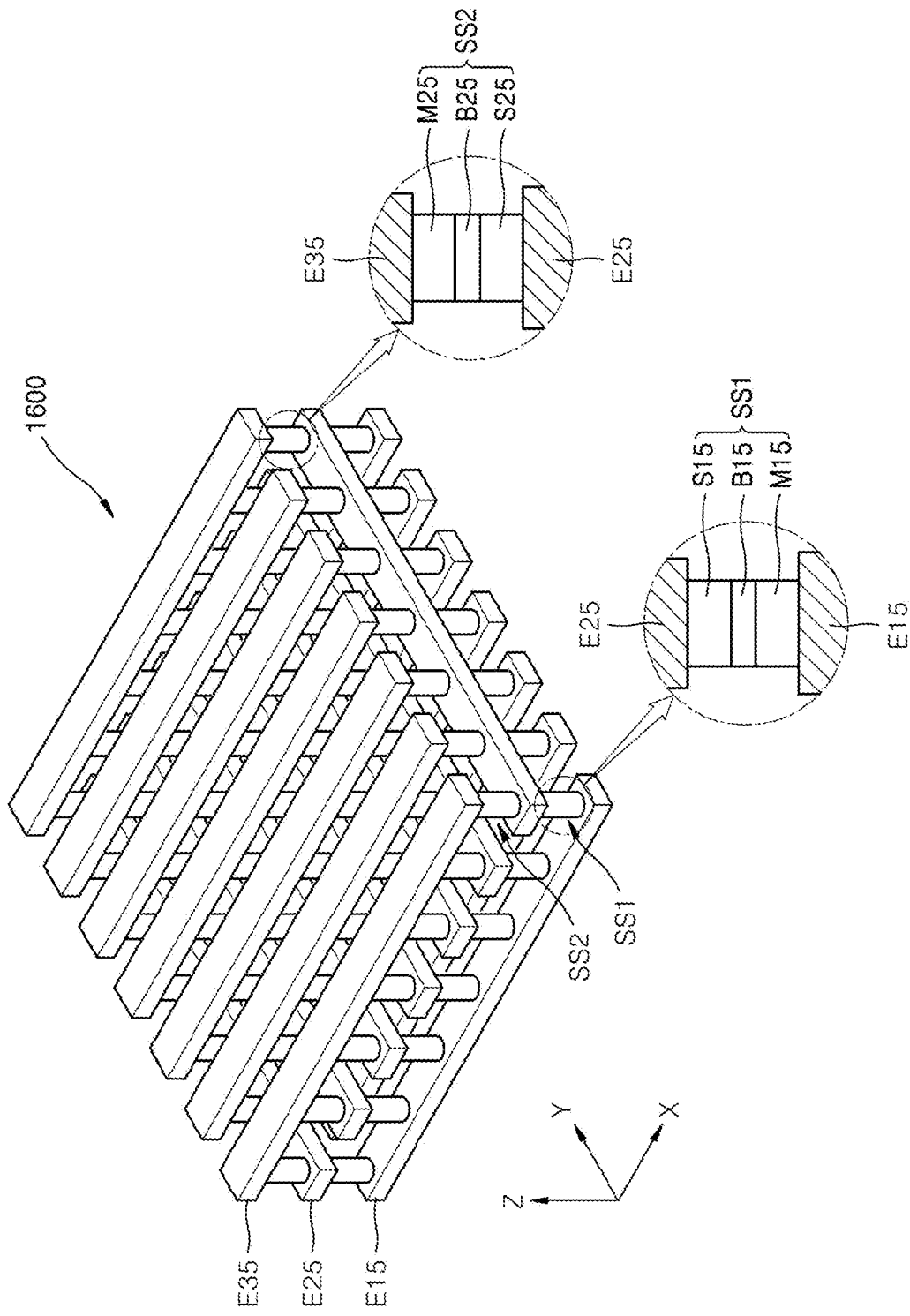

MEMORY DEVICE AND APPARATUS INCLUDING THE SAME

CROSS-REFERENCE TO RELATED APPLICATIONS

This application claims the benefit of Korean Patent Application No. 10-2013-0022967, filed on Mar. 4, 2013, in the Korean Intellectual Property Office, the disclosure of which is incorporated herein in its entirety by reference.

BACKGROUND

Inventive concepts relate to memory devices and/or apparatuses including the same.

Examples of non-volatile memory devices include resistive random access memory (RRAM), magnetic random access memory (MRAM), ferroelectric random access memory (FRAM), phase-change random access memory (PRAM), or the like. Among them, the RRAM is a resistive memory device which stores data based on a resistance change of a material. In a RRAM, the resistance of a resistance-change material is changed from a high-resistance state to a low-resistance state (also referred to as "ON state") when a voltage applied to the resistance-change material is greater than or equal to a set voltage. The resistance of the resistance-change material is switched back to the high-resistance state (also referred to as "OFF state") when a voltage applied to the resistance-change material is greater than or equal to a reset voltage.

Generally, a resistive memory device includes a storage node including a resistance-change layer and a selecting device (selector) electrically connected to the storage node. In this case, a conductive element, i.e., an intermediate electrode is disposed between the storage node and the selecting device. However, when a non-volatile memory device, such as a resistive memory device, is highly integrated or a memory device having a diverse/complicated three-dimensional (3D) structure is implemented, the intermediate electrode may cause several problems.

SUMMARY

Inventive concepts provide a memory device employing a barrier layer including an insulation material between a memory element and a switching element (a selecting element).

Inventive concepts also provide a memory device that may be highly integrated in a three-dimensional (3D) structure.

Inventive concepts also provide a memory device of which nonlinearity characteristics in an ON state may be improved.

Inventive concepts also provide a memory device in which a reaction between a memory element and a switching element is suppressed.

Inventive concepts also provide apparatuses (e.g., an electronic device, a logic device, or the like) including the memory device.

According to at least one example embodiment, a memory device includes a first electrode, a second electrode spaced apart from the first electrode, a memory element disposed between the first electrode and the second electrode, a switching element disposed between the first electrode and the second electrode, and a barrier layer disposed between the memory element and the switching element. The switching element may be configured to control signal access to the memory element and the barrier layer may include an insulation material.

According to at least one example embodiment, one of the first and second electrodes is a vertical electrode and the other electrode is a horizontal electrode.

According to at least one example embodiment, the first electrode has a vertical nanopillar structure, and at least one of the memory element and the switching element has a shell structure surrounding the first electrode.

According to at least one example embodiment, one of the memory element and the switching element is a first element and the other one of the memory element and the switching element is a second element. The first element is a first shell portion that surrounds the first electrode, the barrier layer is a second shell portion that surrounds the first element, and the second element is a third shell portion that surrounds the barrier layer.

According to at least one example embodiment, one of the memory element and the switching element is a first element and the other one of the memory element and the switching element is a second element. The first element is a first shell portion that surrounds the first electrode, the barrier layer is a second shell portion that surrounds the first element, and the second element surrounds at least a portion of the second electrode.

According to at least one example embodiment, one of the memory element and the switching element is a first element and the other one of the memory element and the switching element is a second element. The first element is a shell portion that surrounds the first electrode, the second element surrounds at least a portion of the second electrode, and the barrier layer surrounds at least a portion of the second element.

According to at least one example embodiment, the second electrode is a horizontal electrode, and the second electrode is disposed on at least one side of the first electrode.

According to at least one example embodiment, the first electrode is a plurality of first electrodes. Each of the first electrodes having a vertical structure and being spaced apart from each other. The second electrode is a plurality of second electrodes. Each of the second electrodes having a horizontal structure and crossing the plurality of first electrodes.

According to at least one example embodiment, the first electrode is a first horizontal electrode that extends in a first direction, the second electrode is a second horizontal electrode that extends in a second direction, and the second electrode crosses the first electrode. A first stacked structure is disposed at a crossing point between the first electrode and the second electrode, the first stacked structure including the memory element, the barrier layer, and the switching element.

According to at least one example embodiment, the memory device further includes a third electrode crossing the second electrode, and a second stacked structure disposed at a crossing point between the second electrode and the third electrode. The second stacked structure has one of a reverse structure of the first stacked structure and a same structure as the first stacked structure.

According to at least one example embodiment, the barrier layer has a thickness at which tunneling of electrons occurs.

According to at least one example embodiment, an electric resistance of the barrier layer in a lengthwise direction and a widthwise direction is greater than an electric resistance of the barrier layer in a thickness direction.

According to at least one example embodiment, the memory element includes a resistance-change layer, and the resistance-change layer includes at least one selected from the group of Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, and a mixture thereof.

According to at least one example embodiment, an electronic device includes the above described memory device.

According to at least one example embodiment, the electronic device may be a memory card, such as a multimedia card (MMC) and a secure digital (SD) card, or an electronic system that is used in a mobile phone, a solid state disk (SSD), a household appliance, or the like.

According to at least one aspect of inventive concepts, there is provided a logic device including the above-described memory device. The logic device may include a recognition device or a neuromorphic device, for example.

According to at least one example embodiment, a memory device includes first and second electrodes spaced apart from each other, a memory element disposed between the first and second electrodes, a switching element disposed between the first and second electrodes, and a barrier layer disposed between the memory element and the switching element. The switching element may be configured to control signal access to the memory element, and an electric resistance of the barrier layer in a lengthwise direction and a widthwise direction may be greater than an electric resistance of the barrier layer in a thickness direction.

According to at least one example embodiment, A three-dimensional memory device includes at least one first electrode, at least one second electrode, at least one memory layer between the at least one first and second electrodes, at least one switching device between the at least one first and second electrodes, and at least one barrier layer between the at least one memory layer and the at least one switching device. The at least one barrier layer includes an insulation material and is configured to allow current to flow to the at least one memory layer according to the at least one switching device.

According to at least one example embodiment, the at least one first electrode, the at least one memory layer, the at least one switching device, and the at least one barrier layer are included in a vertical shell structure.

According to at least one example embodiment, the at least one second electrode includes at least two second electrodes extending in a horizontal direction and disposed on opposite sides of the vertical shell structure.

According to at least one example embodiment, the at least one barrier layer has a thickness equal to or less than about 20 Å.

According to at least one example embodiment, an electrical resistance of the at least one barrier layer in a first direction and a second direction is greater than an electrical resistance of the at least one barrier layer in a third direction.

BRIEF DESCRIPTION OF THE DRAWINGS

Exemplary embodiments of inventive concepts will be more clearly understood from the following detailed description taken in conjunction with the accompanying drawings in which:

FIG. 9 is a perspective view of a memory device according at least one example embodiment of inventive concepts.

DETAILED DESCRIPTION OF EXAMPLE EMBODIMENTS

Figure 1:
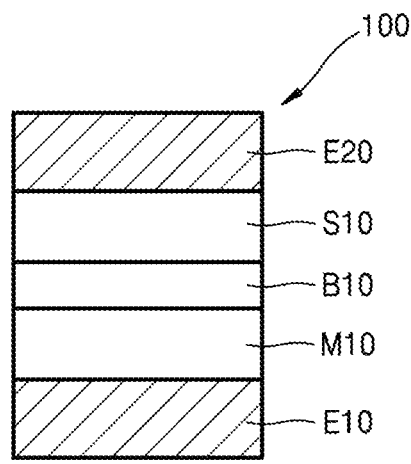
FIG. 1 is a cross-sectional view of a memory device according to at least one example embodiment of inventive concepts.

Various exemplary embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the exemplary embodiments. As used herein, the singular forms "a," "an" and "the" are intended to include the plural forms as well, unless the context clearly indicates otherwise. It will be further understood that the terms "comprises," "comprising," "includes", and/or "including" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are described below, by referring to the figures, to explain inventive concepts. As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of a memory device 100 according to at least one example embodiment of inventive concepts.

Referring to FIG. 1, the memory device 100 may include a first electrode E10 and a second electrode E20 that is spaced apart from the first electrode E10. The memory device 100 may include a memory element (or layer) M10 and a switching element (or device) S10 that are disposed between the first electrode E10 and the second electrode E20. The switching element S10 may control access of a signal to the memory element M10. Also, the memory device 100 may include an insulative barrier layer (hereinafter, referred to as a barrier layer) B10 that is disposed between the memory element M10 and the switching element S10. The memory element M10, the barrier layer B10, and the switching element S10 may be sequentially disposed between the first electrode E10 and the second electrode E20.

The memory element M10 may include a resistance-change layer, for example. In this case, the resistance-change layer may include a material having variable resistance characteristics, for example, a metastable oxide. The metastable oxide may include a transition metal oxide (TMO). More specifically, the resistance-change layer may include at least one oxide from among Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, and a mixture thereof. Alternatively, the resistance-change layer may include a graphene oxide or a carbon nanotube network. However, the above-described materials are exemplary materials, and other materials may be used to form the resistance-change layer. Also, the memory element M10 may include a material layer that is different from the resistance-change layer used in resistive random access memory (RRAM). For example, the memory element M10 may include a magnetic memory layer, a phase-change memory layer, or a ferroelectric memory layer. Accordingly, the memory device 100 may be a resistance-change memory device, a magnetic memory device, a phase-change memory device, or a ferroelectric memory device depending on a material used in the memory element M10.

The switching element S10 may have a function to minimize noise by controlling access of a signal to the memory element M10. The switching element S10 may also be referred to as a selecting element or a selector. The switching element S10 may include one of a threshold switching device, a diode, and a varistor, for example. Here, the threshold switching device may include NiOx, VOx, NbOx, and/or the like. Appropriately adjusting oxygen concentrations of materials (e.g., metal oxides) that make up the threshold switching device may allow for controlling characteristics of the threshold switching device. Meanwhile, if the switching element S10 is configured in a diode structure, then the diode may be a pn diode, a back-to-back pn diode, a Schottky diode, a back-to-back Schottky diode, a tunnel diode, a varactor diode, or a Zener diode. If the switching element S10 is configured in a pn diode structure, then the pn diode may have a bilayer structure including a p-type semiconductor layer and an n-type semiconductor layer, where the p-type semiconductor layer and the n-type semiconductor layer may be oxide layers. However, the p-type semiconductor layer and the n-type semiconductor layer may be non-oxide layers if desired. As described above, the configuration of the switching element S10 may be modified in various ways.

The barrier layer B10 may include an insulation material. For example, the insulation material may be an oxide or a nitride. Specifically, the barrier layer B10 may include SiOx, SiNx, AlOx, MgOx, HfOx, BNx, or the like. An energy bandgap of the barrier layer B10 may be equal to or greater than about 1.5 eV. The barrier layer B10 may be formed to a thickness such that tunneling of electrons may occur. Accordingly, the barrier layer B10 may allow current to flow to the memory element M10 according to the switching element S10. In this case, the barrier layer B10 may be formed to a thickness that is equal to or less than about 20 Å. Due to the tunneling effect of electrons, the barrier layer B10 may have a relatively low electrical resistance in a thickness direction of the barrier layer B10, i.e., in an out-of-plane direction. That is, the electrical resistance of the barrier layer B10 in the thickness direction, i.e., in the out-of-plane direction may be lower than an electrical resistance of the barrier layer B10 in a lengthwise/widthwise direction, i.e., in an in-plane direction. In this case, the thickness direction is a direction that is parallel to a straight line (e.g., vertical line) that connects the memory element M10 and the switching element S10. Also, the barrier layer B10 may be a layer including many defects. Due to the defects, the barrier layer B10 may have a relatively low electrical resistance in the thickness direction, i.e., in the out-of-plane direction. The electrical resistance of the barrier layer B10 in the thickness direction and the electrical resistance of the barrier layer B10 in the lengthwise/widthwise direction may vary depending on directivity of the defects. In this regard, the electrical resistance of the barrier layer B10 in the lengthwise/widthwise direction may be greater than the electrical resistance of the barrier layer B10 in the thickness direction. When the effect caused by the defects is used, the thickness of the barrier layer B10 may increase compared to a case where the tunneling effect of electrons is used. For example, when the effect caused by the defects is used, the thickness of the barrier layer B10 may be determined to be equal to or less than about 100 Å. Both the tunneling effect of electrons and the effect caused by the defects may be used if desired. By using the barrier layer B10, a memory device having a three-dimensional (3D) structure may be easily implemented, nonlinearity characteristics of the memory device may be improved, and a reaction between the memory element M10 and the switching element S10 may be suppressed. This will be described later in more detail.

In at least one example embodiment, the barrier layer B10 may be formed to a thickness that is about 1 Å to about 20 Å, when using the tunneling effect, as described above. In at least one example embodiment, the barrier layer B10 may be formed of a thickness that is about 1 Å to about 100 Å, when using the effect caused by the defects, as described above.

The memory device 100 of FIG. 1 may be a device having one switching element S10 and one memory element M10 in a memory cell. When the memory element M10 is a resistor, such as a resistance-change layer, the memory device 100 may have an 1S-1R structure, i.e., a "1 switch-1 resistor" structure or a "1 selector-1 resistor" structure.

The configuration of the memory device 100 illustrated in FIG. 1 is an illustration example and may be modified in various ways. For example, in FIG. 1, the positions of the memory element M10 and the switching element S10 may be switched. Also, the first electrode E10, the memory element M10, the barrier layer B10, the switching element S10, and the second electrode E20 are illustrated in a single layer structure; however, at least one thereof may have a multilayer structure. Further, the shapes and arrangements of the first electrode E10, the memory element M10, the barrier layer B10, the switching element S10, and the second electrode E20 may be modified in various ways.

Figure 2:
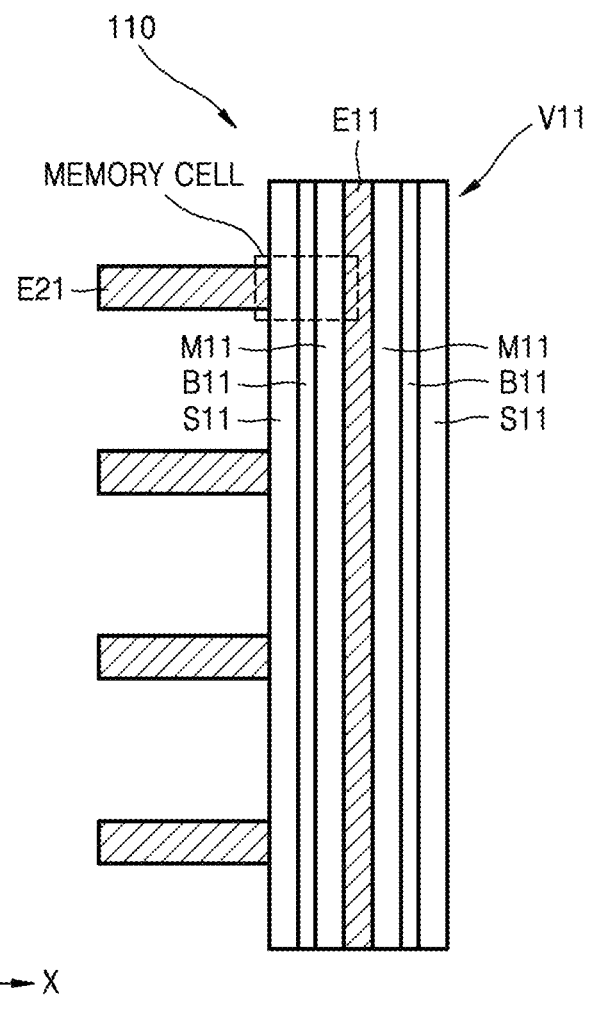
FIG. 2 is a cross-sectional view of a memory device according to at least one example embodiment of inventive concepts.

FIG. 2 is a cross-sectional view of a memory device 110 according to at least one example embodiment of inventive concepts.

Referring to FIG. 2, a first electrode E11 may have a structure extended in a vertical direction, i.e., a z-axis direction. For example, the first electrode E11 may have a vertical nanopillar structure. A second electrode E21 may have a structure extended in a horizontal direction, for example, a y-axis direction. The second electrode E21 may be disposed to cross the first electrode E11. A plurality of second electrodes E21 may be spaced apart from each other in the vertical direction with respect to the first electrode E11. Although not shown, a plurality of first electrodes E11 may also be spaced apart from each other. For example, the plurality of first electrodes E11 may be spaced apart from each other in the horizontal direction, for example, the y-axis direction and/or an x-axis direction.

A memory element M11 may have a shell structure (e.g., a vertical shell structure) that surrounds the first electrode E11. A barrier layer B11 may have a shell structure that surrounds the memory element M11. A switching element S11 may have a shell structure that surrounds the barrier layer B11. Thus, the first electrode E11 may be referred to as a core portion, the memory element M11 may be referred to as a first shell portion, the barrier layer B1 may be referred to as a second shell portion, and the switching element S11 may be referred to as a third shell portion. The first electrode E11, the memory element M11, the barrier layer B11, and the switching element S11 may constitute one vertical structure V11 (or vertical shell structure). The barrier layer B11 may allow current to flow to the memory element M11 according to the switching element S11. The second electrode E21 may be disposed to contact a lateral side of the vertical structure V11, which here is a lateral side of the switching element S11.

The positions of the memory element M11 and the switching element S11 may be switched. In other words, the switching element S11 may be a first shell portion that surrounds the first electrode E11, the barrier layer B11 may be a second shell portion that surrounds the switching element S11, and the memory element M11 may be a third shell portion that surrounds the barrier layer B11. In this case, the second electrode E21 may contact a lateral side of the memory element M11.

Portions of the memory element M11, the barrier layer B11, and the switching element S11, which are disposed at a cross point between the first electrode E11 and the second electrode E21, may constitute one 'memory cell'. A desired (or alternatively) predetermined electrical signal may be applied between the first electrode E11 and one of the plurality of second electrodes E21 so that an operation (e.g., data writing/reading/erasing or the like) with respect to a 'memory cell' in a region where the first electrode E11 and one of the second electrodes E21 cross each other may be performed. Since the barrier layer B11 including an insulation material is used, when a selective operation with respect to one memory cell is performed, malfunction on memory cells adjacent to the memory cell undergoing the selective operation may be mitigated (or alternatively, prevented). If an intermediate electrode is used instead of the barrier layer B11, the intermediate electrode may allow a current to very fast flow in the z-axis direction (a lengthwise direction), the selective operation on one memory cell is not as easily performed, and malfunction on the adjacent memory cells may occur. In other words, an electric short between adjacent memory cells may occur due to the intermediate electrode. Thus, when the intermediate electrode is used instead of a barrier layer B11, it may be difficult to implement the memory device 110 having the structure of FIG. 2. However, when the barrier layer B11 including the insulation material is used, the above-described problems may be mitigated (or alternatively, prevented) so that a three-dimensional (3D) memory device (a highly-integrated memory device) having various configurations may be easily implemented. Since the barrier layer B11 may have a high electric resistance in the lengthwise direction, i.e., the z-axis direction, and may have a relatively low electric resistance in a thickness direction, i.e., a direction in which the memory element M11 and the switching element S11 are connected to each other, electric signal transmission between the memory element M11 and the switching element S11 may be allowed, and an occurrence of an electric short in the lengthwise direction may be reduced (or alternatively, prevented).

Also, when the barrier layer B11 including the insulation material is used, nonlinearity characteristics of the memory cell in an ON state may be greatly improved. When the intermediate electrode is used instead of the barrier layer B11, the intermediate electrode as a conductor does not contribute to the nonlinearity characteristics of the memory cell because the nonlinearity characteristics of the memory cell may be influenced by the switching element S11. However, when the barrier layer B11 including the insulation material is used, the barrier layer B11 may affect an improvement in the nonlinearity characteristics. In this case, the nonlinearity characteristics may be determined by the barrier layer B11 and the switching element S11. Thus, the nonlinearity characteristics may be improved, and an ON/OFF ratio of the memory cell may increase. In this regard, characteristics of the memory device 110 may be improved.

Additionally, when the barrier layer B11 including the insulation material is used, a reaction between the memory element M11 and the switching element S11 may be suppressed (or alternatively, prevented). Thus, property changes of the memory device 110 caused by a chemical reaction between the memory element M11 and the switching element S11 may be suppressed (or alternatively, prevented). As a result, reliability and stability of the memory device 110 may be improved.

Figure 3:
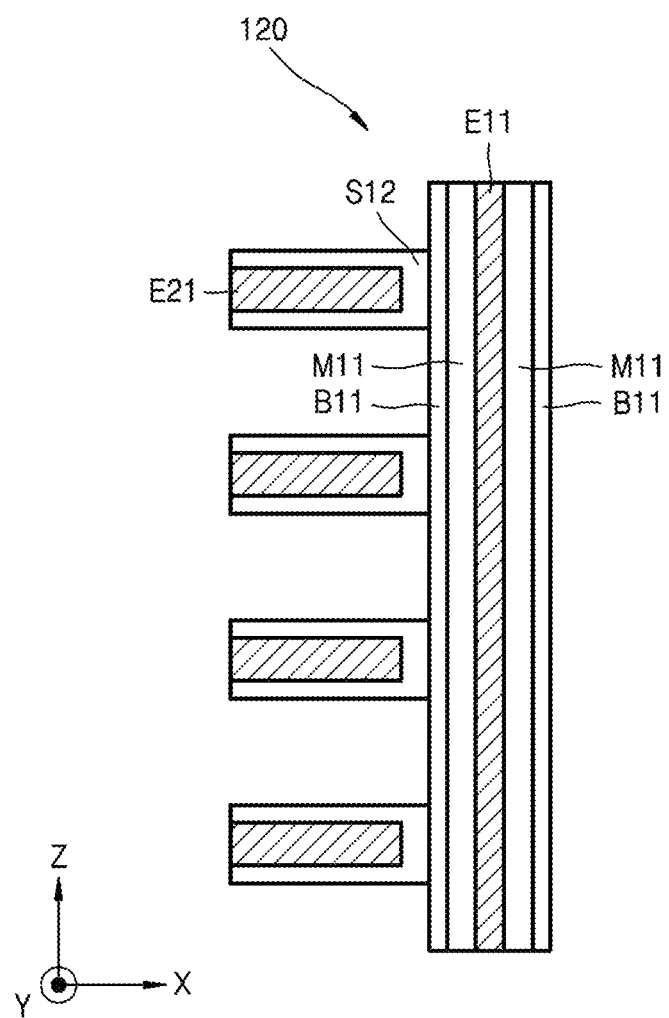
FIG. 3 is a cross-sectional view of a memory device according to at least one example embodiment of inventive concepts.
Figure 4:
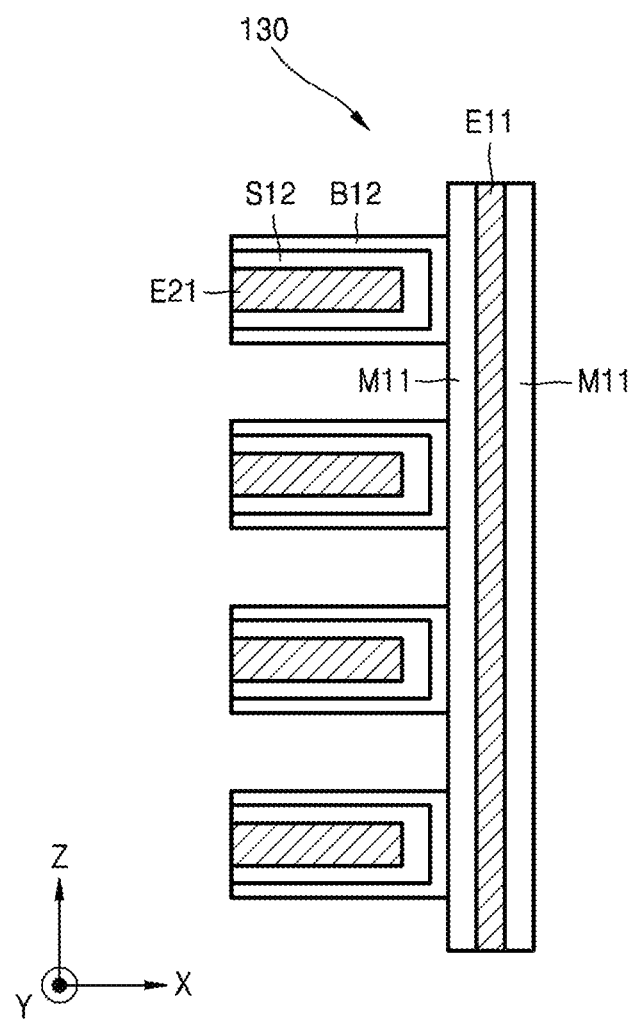
FIG. 4 is a cross-sectional view of a memory device according to at least one example embodiment of inventive concepts.

The structure of FIG. 2 may be modified in various ways. Modification examples thereof are shown in FIGS. 3 and 4. Reference numerals 120 and 130 of FIGS. 3 and 4 represent 'memory devices' according to at least one example embodiment of inventive concepts.

Referring to FIG. 3, a switching element S12 may have a structure other than a shell structure that surrounds a barrier layer B11. For example, the switching element S12 may have a structure that surrounds (or covers) at least a portion of the second electrode E21. The switching element S12 may be disposed between a lateral side of a second electrode E21 facing the barrier layer B11 and the barrier layer B11, and may cover at least a portion of top and bottom surfaces of the second electrode E21. However, the switching element S12 may not cover the top and bottom surfaces of the second electrode E21 if desired. The structure of FIG. 3 may be the same as or similar to that of FIG. 2 except for the structure of the switching element S12.

FIG. 4 illustrates a case where the structure of the barrier layer B11 of FIG. 3 is modified.

Referring to FIG. 4, a switching element S12 may have a structure that surrounds (or covers) at least a portion of the second electrode E21, and a barrier layer B12 may have a structure that surrounds (or covers) at least a portion of the switching element S12. The barrier layer B12 may be disposed between a lateral side of the switching element S12 facing a memory element M11 and the memory element M11, and may cover at least a portion of top and bottom surfaces of the switching element S12. However, the barrier layer B12 may not cover the top and bottom surfaces of the switching element S12. The structure of FIG. 4 may be the same as or similar to that of FIG. 3 except for the structure of the barrier layer B12.

Similar to the structure of FIG. 2, in the structures of FIGS. 3 and 4, the positions and shapes of the memory element M11 and the switching element S12 may be switched (or modified). That is, in FIGS. 3 and 4, a 'switching element' having the same shape as that of the memory element M11 may be disposed in the position of the memory element M11, and a 'memory element' having the same shape as that of the switching element S12 may be disposed in the position of the switching element S12.

Figure 5:
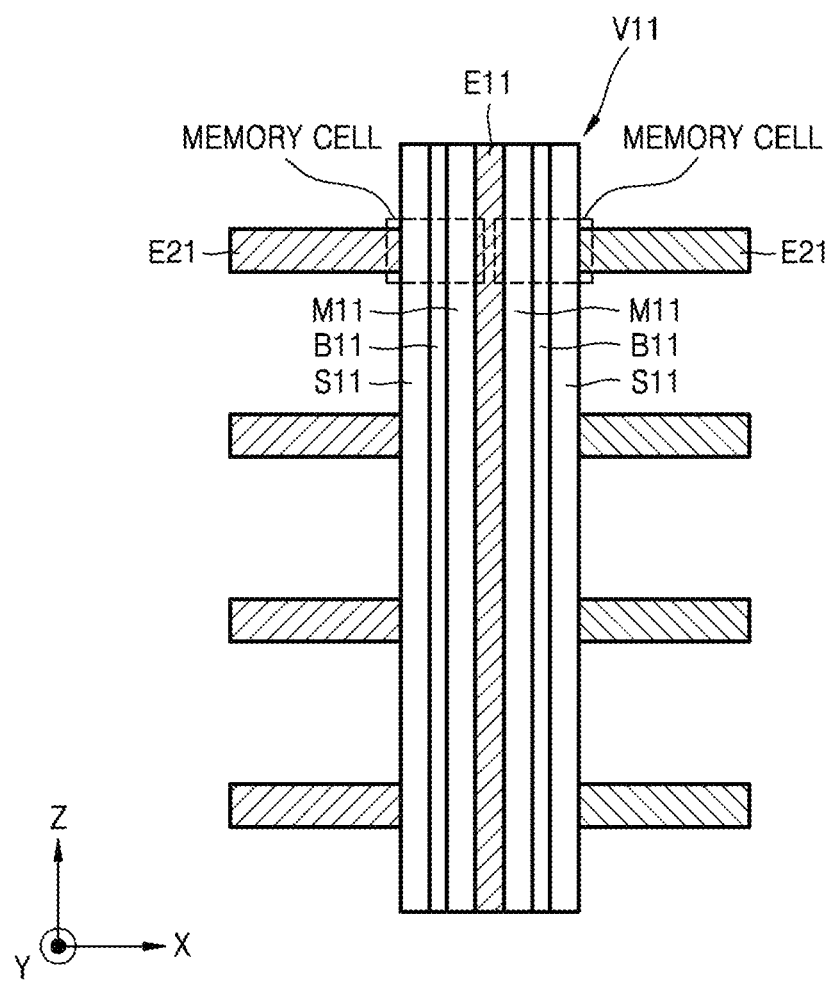
FIG. 5 is a cross-sectional view of a memory device according to at least one example embodiment of inventive concepts.

Also, although in FIGS. 2 through 4 the second electrode E21 is disposed at one side of the first electrode E11, the second electrode E21 may be disposed at both sides of the first electrode E11. For example, as illustrated in FIG. 5, the second electrode E21 may be disposed at both sides of a vertical structure V11. FIG. 5 illustrates an example embodiment where, in the structure of FIG. 2, the second electrode E21 is disposed at both sides of the vertical structure V11. In this case, a region of a cross point between the first electrode E11 and the second electrode E21 disposed at one side of the first electrode E11 may be a first memory cell region, and a region of a cross point between the first electrode E11 and the second electrode E21 disposed at the other side of the first electrode E11 may be a second memory cell region. In the structures of FIGS. 3 and 4, the second electrode E21 may be disposed at both sides of the first electrode E11. Also, the structures of FIGS. 2 through 4 may be modified in other ways.

Figure 6:
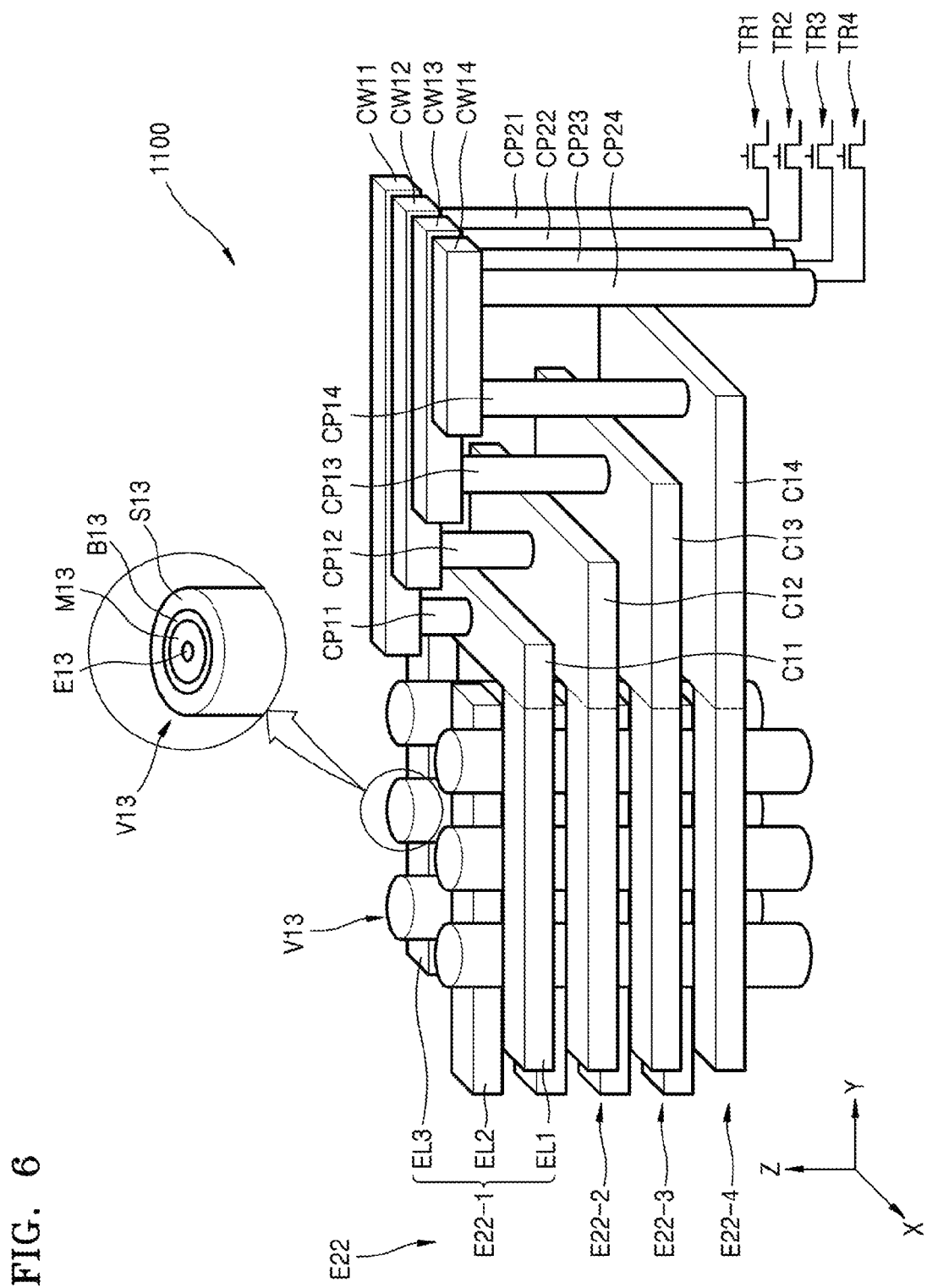
FIG. 6 is a perspective view of a memory device according to at least one example embodiment of inventive concepts.

FIG. 6 is a perspective view of a memory device 1100 according to at least one example embodiment of inventive concepts.

Referring to FIG. 6, a plurality of vertical structures V13 (or vertical shell structures) may be arranged spaced apart from each other in the horizontal direction (e.g., x direction and/or y direction). Each of the plurality of vertical structures V13 may have a configuration that is the same as or similar to the vertical structure V11 of FIG. 2. In other words, the vertical structure V13 may include a first electrode E13, and further include a memory element M13, a barrier layer B13, and a switching element S13 which surround the first electrode E13. The positions of the memory element M13 and the switching element S13 may be switched (or reversed). The plurality of vertical structures V13 may be arranged in a plurality of columns and in a plurality of rows. Here, the plurality of vertical structures V13 form two rows and three columns; however, example embodiments are not limited thereto, and the arrangement of the vertical structures V13 may be modified in various ways.

A plurality of second electrodes E22 may have a horizontal structure and may be arranged spaced apart from each other. The plurality of second electrodes E22 may be disposed to be spaced apart from each other in the vertical direction and in the horizontal direction. The plurality of second electrodes E22 may be disposed to cross the plurality of vertical structures V13. Since each of the vertical structures V13 includes a first electrode E13, the plurality of second electrodes E22 may cross the plurality of first electrodes E13.

The plurality of second electrodes E22 may include electrode structures that are divided into a plurality of levels, i.e., structures that have different heights. Here, the plurality of second electrodes E22 include electrode structures that are divided into four levels. The electrode structures that constitute the plurality of second electrodes E22 may be divided into a plurality of levels, such as a (2-1)-th electrode structure E22-1, a (2-2)-th electrode structure E22-2, a (2-3)-th electrode structure E22-3, and a (2-4)-th electrode structure E22-4. The plurality of second electrodes E22 may include a plurality of electrode lines that are spaced apart from each other in the horizontal direction at each level, and the plurality of vertical structures V13 may be disposed between the plurality of electrode lines. For example, the (2-1)-th electrode structure E22-1 may include a first electrode line EL1, a second electrode line EL2, and a third electrode line EL3, which are spaced apart from each other in the x-axis direction. The second electrode line EL2 may be disposed between the first electrode line EL1 and the third electrode line EL3. Portions of the plurality of vertical structures V13 may be disposed between the first electrode line EL1 and the second electrode line EL2, and other portions of the plurality of vertical structures V13 may be disposed between the second electrode line EL2 and the third electrode line EL3. In this case, the first electrode line EL1 and the third electrode line EL3 may be electrically connected to each other. For example, a (1-1)-th connector C11 that connects one end of the first electrode line EL1 and one end of the third electrode line EL3 may be disposed. The (2-2)-th electrode structure E22-2, the (2-3)-th electrode structure E22-3, and the (2-4)-th electrode structure E22-4 may have a similar structure to that of the (2-1)-th electrode structure E22-1. A (1-2)-th connector C12, a (1-3)-th connector C13, and a (1-4)-th connector C14 may be disposed on the (2-2)-th electrode structure E22-2, the (2-3)-th electrode structure E22-3, and the (2-4)-th electrode structure E22-4, respectively. The widths of the (1-1)-th connector C11 through the (1-4)-th connector C14 may gradually increase from the (1-1)-th connector C11 to the (1-4)-th connector C14. Thus, contact plugs CP11, CP12, CP13, and CP14 may be formed on and contact the connectors C11, C12, C13, and C14, respectively. Connection wirings CW11, CW12, CW13, and CW14 may be disposed on the contact plugs CP11, CP12, CP13, and CP14, respectively. The contact plugs CP11, CP12, CP13, and CP14 may be disposed on bottom surfaces of ends of the connection wirings CW11, CW12, CW13, and CW14, respectively. Other contact plugs CP21, CP22, CP23, and CP24 may be disposed on bottom surfaces of the other ends of the connection wirings CW11, CW12, CW13, and CW14, respectively. The other contact plugs CP21, CP22, CP23, and CP24 may be connected to first through fourth transistors TR1, TR2, TR3, and TR4, respectively. Thus, the connectors C11, C12, C13, and C14 may be connected to the first through fourth transistors TR1, TR2, TR3, and TR4, respectively. Electric signals may be applied to the electrode structures E22-1, E22-2, E22-3, and E22-4 through the first through fourth transistors TR1, TR2, TR3, and TR4, respectively. More specifically, electric signals may be applied to the first and third electrode lines EL1 and EL3 of the electrode structures E22-1, E22-2, E22-3, and E22-4 through the first through fourth transistors TR1, TR2, TR3, and TR4. Although not shown, other transistors connected to second electrode lines EL2 of the plurality of second electrodes E22 may be further disposed.

In the structure of FIG. 6, since a signal applied to the first electrode line EL1 and a signal applied to the second electrode line EL2 may be independently controlled, a memory cell that exists in a region of a cross point between the first electrode line EL1 and the vertical structure V13 and a memory cell that exists in a region of a cross point between the second electrode line EL2 and the vertical structure V13 may be independently controlled. That is, in one vertical structure V13, a region that is adjacent to the first electrode line EL1 and a region that is adjacent to the second electrode line EL2 may be used for different memory cells. Thus, a data recording density per unit area may be significantly improved.

Figure 7:
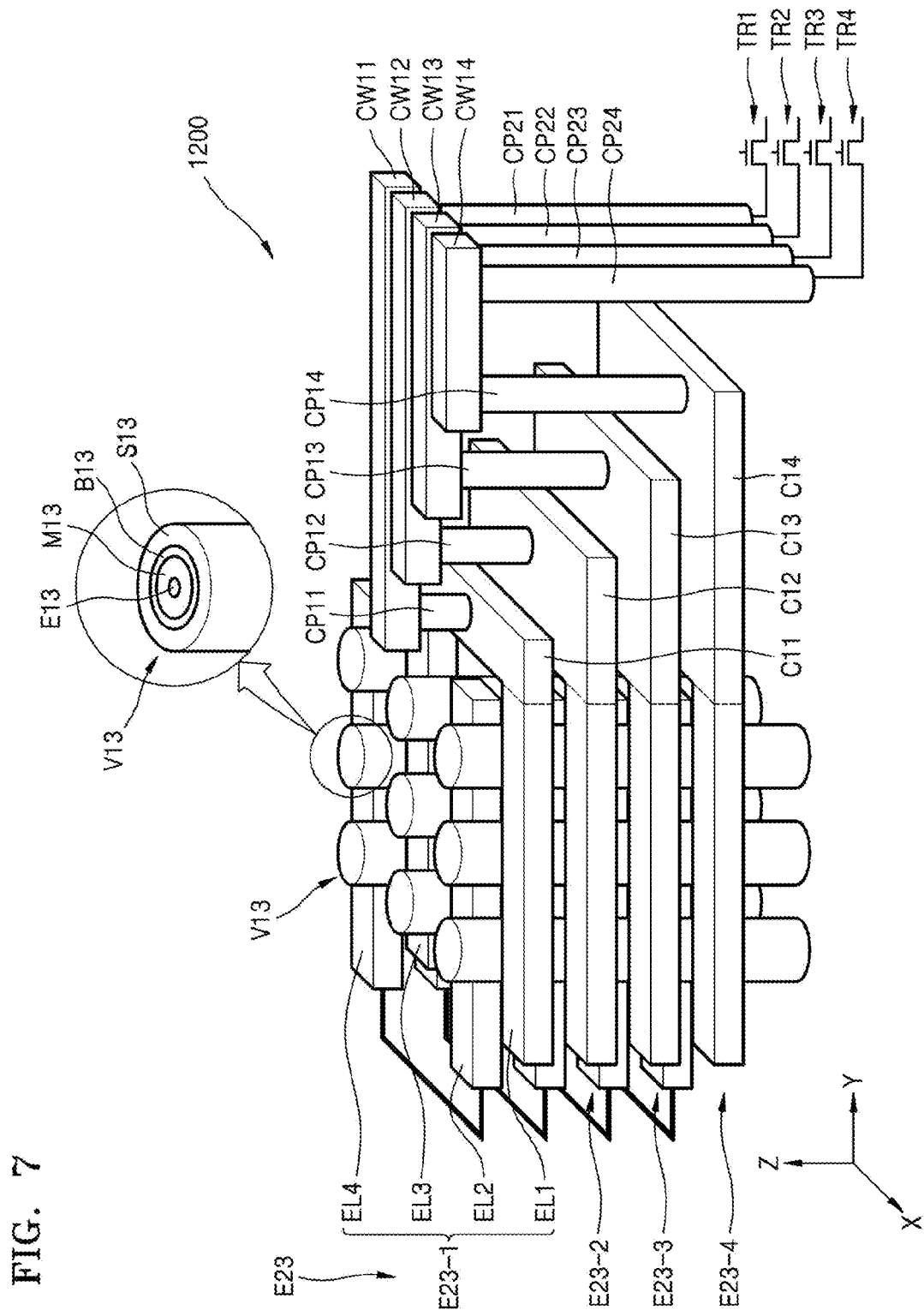
FIG. 7 is a perspective view of a memory device according to at least one example embodiment of inventive concepts.

FIG. 7 is a perspective view of a memory device 1200 according to at least one example embodiment of inventive concepts. FIG. 7 is a view of a modified version of the memory device 1100 of FIG. 6.

Referring to FIG. 7, a plurality of vertical structures V13 are arranged in three rows and in three columns. In this case, a plurality of second electrodes E23 may further include a fourth electrode line EL4 at each level. A third electrode line EL3 may be disposed between the fourth electrode line EL4 and a second electrode line EL2. Portions of the plurality of vertical structures V13 may be disposed between the third electrode line EL3 and the fourth electrode line EL4. In this case, the second electrode line EL2 and the fourth electrode line EL4 may be electrically connected to each other. This is similar to a case where the first electrode line EL1 is electrically connected to the third electrode line EL3. A structure of connection between the second electrode line EL2 and the fourth electrode line EL4 is illustrated simply as a 'connection line' (shown as a solid line) for the sake of convenience but may be the same as or similar to a structure of connection between the first electrode line EL1 and the third electrode line EL3. In other words, the 'connection line' that connects the second electrode line EL2 and the fourth electrode line EL4 may have a structure that is the same as or similar to the connectors C11, C12, C13, and C14 that connect the first electrode line EL1 and the third electrode line EL3. Also, a 'connector' that connects the second electrode line EL2 and the fourth electrode line EL4 at each level may be electrically connected to another transistor (not shown). In FIG. 7, reference numerals E23-1, E23-2, E23-3, and E23-4 represent electrode structures that constitute the plurality of second electrodes E23.

In FIG. 7, the number of vertical structures V13 may increase or their arrangement method may vary. Thus, the configuration or arrangement of the plurality of second electrodes E23 may vary. Also, the configuration of connection structures that are connected to the plurality of second electrodes E23, for example, CP11+CW11+CP21, may be modified in various ways.

The structure of FIG. 2 is basically applied to FIGS. 6 and 7. However, the structure of FIG. 3 or 4 instead of the structure of FIG. 2 may also be applied to FIGS. 6 and 7. This modification structure would be obvious to one of ordinary skill in the art and thus, drawings and detailed descriptions thereof will be omitted.

In example embodiments of FIGS. 2 through 7, the first electrodes E11 and E13 are 'vertical electrodes', and the second electrodes E21, E22, and E23 are 'horizontal electrodes'. However, in at least one example embodiment of inventive concepts, the structures and arrangements of the first and second electrodes may vary. Also, the structure and arrangement of a memory cell disposed between the first and second electrodes may vary.

Figure 8:
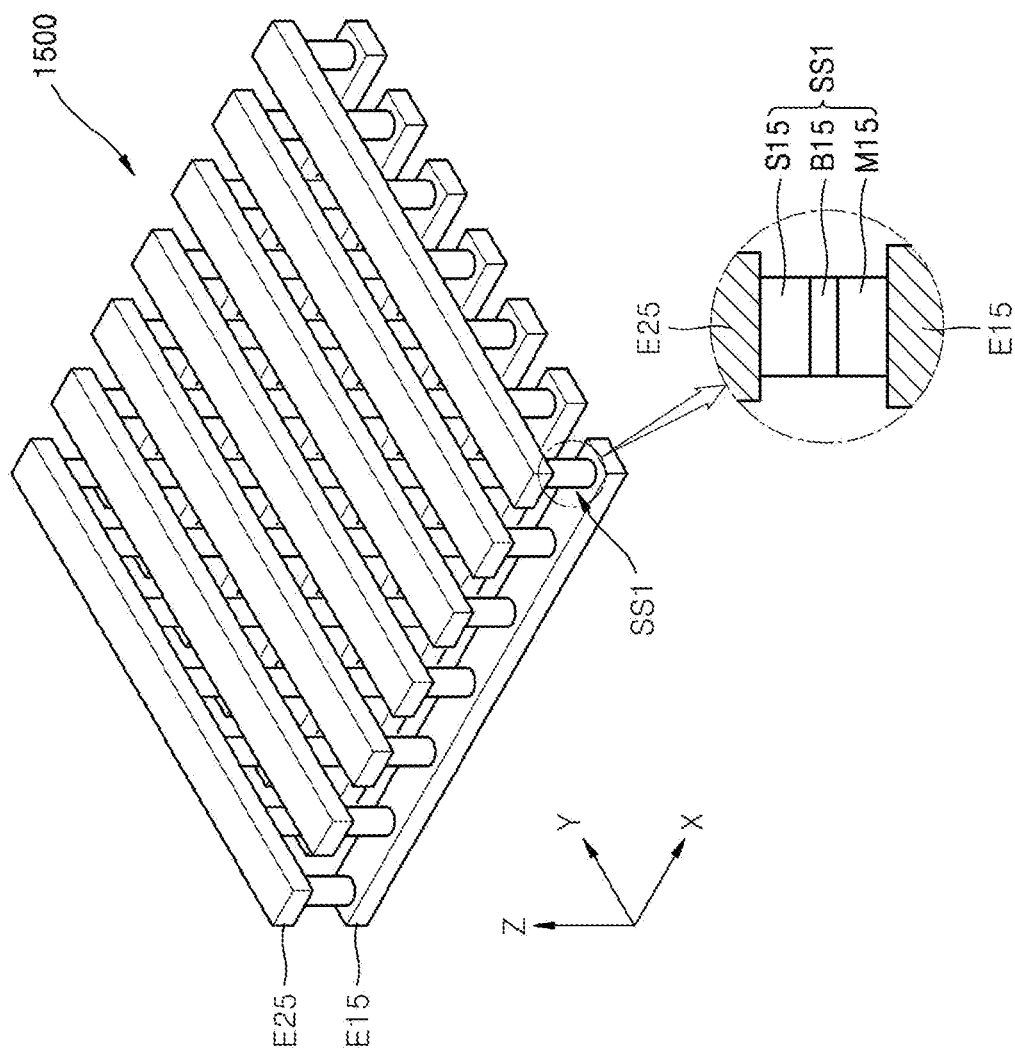
FIG. 8 is a perspective view of a memory device according to at least one example embodiment of inventive concepts.

FIG. 8 is a perspective view of a memory device 1500 according to at least one example embodiment of inventive concepts.

Referring to FIG. 8, a plurality of first electrodes (or wirings) E15 that extend in a first direction, for example, in an x-axis direction may be disposed in parallel to each other. A plurality of second electrodes (or wirings) E25 that extend in a direction in which the plurality of second electrodes E25 cross the plurality of first electrodes E15, for example, in a y-axis direction, may be disposed. A first stacked structure (or a first memory cell) SS1 may be disposed at a cross point between the first electrode E15 and the second electrode E25. The first stacked structure SS1 may include a first memory element (or layer) M15, a first barrier layer B15, and a first switching element (or device) S15, which are sequentially stacked on the first electrode E15. The barrier layer B15 may allow current to flow to the memory element M15 according to the first switching element S15. In the first stacked structure SS1, the positions of a lower structure, i.e., the first memory element M15, and an upper structure, i.e., the first switching element S15, based on a first barrier layer B15 may be switched (or reversed). A material and configuration of each of the first memory element M15, the first barrier layer B15, and the first switching element S15 may correspond to a material and configuration of the memory element M10, the barrier layer B10, and the switching element S10 of FIG. 1. Also, the first electrode E15 and the second electrode E25 may correspond to the first electrode E10 and the second electrode E20 of FIG. 1, respectively.

A second memory cell and a third electrode (wiring) may be further disposed on the second electrode E25 of FIG. 8. An example thereof is shown in FIG. 9. In FIG. 9, reference numeral 1600 represents a memory device according to at least one example embodiment of inventive concepts.

Referring to FIG. 9, the first electrodes E15, the second electrodes E25, and the first stacked structures (or the first memory cells) SS1 therebetween, which are described with reference to FIG. 8, may be disposed. Third electrodes (or wirings) E35 may be further disposed to be spaced apart from top surfaces of the second electrodes E25 by desired (or alternatively, predetermined) gaps. The third electrodes E35 may cross the second electrodes E25 and may be arranged at equal intervals. A second stacked structure (or a second memory cell) SS2 may be disposed at a cross point between the second electrodes E25 and the third electrodes E35. The second stacked structure SS2 may have a structure in which the first stacked structure SS1 is reversed upside down, i.e., a reverse structure, or may have the same stacked structure as the first stacked structure SS1. Here, the second stacked structure SS2 has the reverse structure of the first stacked structure SS1. More specifically, the second stacked structure SS2 may include a second switching element S25, a second barrier layer B25, and a second memory element M25, which are sequentially stacked on the second electrode E25. The second switching element S25, the second barrier layer B25, and the second memory element M25 may be material layers that are the same as or similar to the first switching element S15, the first barrier layer B15, and the first memory element M15 of the first stacked structure SS1, respectively. When the first and second switching elements S15 and S25 have a multi-layer structure (or a stacked structure), the second switching element S25 may have the reverse structure of the first switching element S15 or the same stacked structure as the first switching element S15. That is, a switching direction of the second switching element S25 may be opposite to or the same as a switching direction of the first switching element S15. In the second stacked structure SS2, the positions of a lower structure, i.e., the second switching element S25 and an upper structure, i.e., the second memory element M25 based on the second barrier layer B25 may be reversed. The second electrode E25 and the third electrode E35 may correspond to the first electrode E10 and the second electrode E20 of FIG. 1, respectively, or may correspond to the second electrode E20 and the first electrode E10 of FIG. 1, respectively.

In FIGS. 8 and 9, the first and second stacked structures SS1 and SS2 have cylindrical shapes but may have various modified shapes, such as square pillar shapes or shapes in which the widths of the first and second stacked structures SS1 and SS2 increase closer to lower portions thereof. For example, the first and second stacked structures SS1 and SS2 may have asymmetric shapes that extend to outside of a cross point between the first and second electrodes E15 and E25 and outside of a cross point between the second and third electrodes E25 and E35. As such, it should be understood that the structures of FIGS. 8 and 9 may be modified in various ways.

Here, although not shown, the memory device 1600 of FIG. 9 may further include a stacked structure that is the same as a stacked structure of the first stacked structure SS1 and the second electrodes E25, on the third electrodes E35.

Alternatively, a memory device according to at least one example embodiment of inventive concepts may further include at least one set of a stacked structure that is the same as a stacked structure that includes the first stacked structure SS1, the second electrodes E25, the second stacked structure SS2 and the third electrodes E35, on the third electrodes E35.

Alternatively, a resistive memory device according to at least one example embodiment of inventive concepts may further include at least one set of a stacked structure that is the same as a stacked structure that includes the first stacked structure SS1, the second electrode E25, the second stacked structure SS2, the third electrodes E35, the first stacked structure SS1, and the second electrodes E25, which are sequentially stacked, disposed on the third electrodes E35.

In the memory devices 1500 and 1600 having the same structures as those of FIGS. 8 and 9, i.e., in multi-layer cross point memory devices, characteristics (e.g., nonlinearity characteristics or the like), reliability, and stability of the memory devices 1500 and 1600 may be improved due to the barrier layers B15 and B25 including insulation materials. This may be similar to the effect caused by the barrier layer B11 described with reference to FIG. 2.

Memory devices according to the one or more example embodiments may be applied to various electronic devices, logic devices, and the like. Here, the electronic devices may be, for example, memory cards, such as multimedia cards (MMCs) and secure digital (SD) cards, or electronic systems that are used in mobile phones, solid state disks (SSDs), household appliances or the like. The logic devices may include, for example, recognition devices or neuromorphic devices. The recognition devices may be devices configured to recognize a motion, voice or numbers. The configuration of the above-described electronic devices or logic devices would be obvious to one of ordinary skill in the art and thus drawings and descriptions thereof will be omitted.

While inventive concepts have been particularly shown and described with reference to exemplary embodiments thereof, it will be understood by one of ordinary skill in the art that various changes in form and details may be made therein without departing from the spirit and scope of inventive concepts as defined by the following claims. For example, it would be obvious to one of ordinary skill in the art that the structures of the memory devices as shown in FIGS. 1 through 9 may also be modified in various ways. In detail, at least one other material layer may be further disposed between the first electrode E10 and the memory element M10 and/or between the switching element S10 and the second electrode E20, and the memory element M10 and/or the switching element S10 may have a multi-layer structure. In addition, the structures and arrangement methods of the first electrode E10, the memory element M10, the barrier layer B10, the switching element S10 and the second electrode E20 may be modified in various ways. The scope of this application is defined by the appended claims, and all differences within the scope should be construed as being included in inventive concepts.

What is claimed is:

1. A memory device, comprising:
   a first electrode;
   a second electrode spaced apart from the first electrode;
   a memory element disposed between the first electrode and the second electrode;
   a switching element disposed between the first electrode and the second electrode, and the switching element being configured to control signal access to the memory element; and
   a barrier layer disposed between the memory element and the switching element, the barrier layer including an insulation material, an electric resistance of the barrier layer varying in at least two different directions.

2. The memory device of claim 1, wherein one of the first and second electrodes is a vertical electrode and the other electrode is a horizontal electrode.

3. The memory device of claim 1, wherein the first electrode has a vertical nanopillar structure, and at least one of the memory element and the switching element has a shell structure surrounding the first electrode.

4. The memory device of claim 3, wherein one of the memory element and the switching element is a first element and the other one of the memory element and the switching element is a second element, and
> the first element is a first shell portion that surrounds the first electrode,
> the barrier layer is a second shell portion that surrounds the first element, and
> the second element is a third shell portion that surrounds the barrier layer.

5. The memory device of claim 3, wherein one of the memory element and the switching element is a first element and the other one of the memory element and the switching element is a second element, and
> the first element is a first shell portion that surrounds the first electrode,
> the barrier layer is a second shell portion that surrounds the first element, and,
> the second element surrounds at least a portion of the second electrode.

6. The memory device of claim 3, wherein one of the memory element and the switching element is a first element and the other one of the memory element and the switching element is a second element, and
> the first element is a shell portion that surrounds the first electrode,
> the second element surrounds at least a portion of the second electrode, and
> the barrier layer surrounds at least a portion of the second element.

7. The memory device of claim 3, wherein,
the second electrode is a horizontal electrode, and
the second electrode is disposed on at least one side of the first electrode.

8. The memory device of claim 1, wherein,
the first electrode is a plurality of first electrodes, each of the first electrodes having a vertical structure and being spaced apart from each other, and
the second electrode is a plurality of second electrodes, each of the second electrodes having a horizontal structure and crossing the plurality of first electrodes.

9. The memory device of claim 1, wherein the first electrode is a first horizontal electrode that extends in a first direction, the second electrode is a second horizontal electrode that extends in a second direction, and the second electrode crosses the first electrode, and
> wherein a first stacked structure is disposed at a crossing point between the first electrode and the second electrode, the first stacked structure including the memory element, the barrier layer, and the switching element.

10. The memory device of claim 9, further comprising:
a third electrode crossing the second electrode; and
a second stacked structure disposed at a crossing point between the second electrode and the third electrode,
wherein the second stacked structure has one of a reverse structure of the first stacked structure and a same structure as the first stacked structure.

11. The memory device of claim 1, wherein the barrier layer has a thickness at which tunneling of electrons occurs.

12. The memory device of claim 1, wherein the electric resistance of the barrier layer in a lengthwise direction and a widthwise direction is greater than an electric resistance of the barrier layer in a thickness direction.

13. The memory device of claim 1, wherein the memory element includes a resistance-change layer, and the resistance-change layer includes at least one selected from the group of Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, and a mixture thereof.

14. An electronic device comprising the memory device of claim 1.

15. A memory device, comprising:
first and second electrodes spaced apart from each other;
a memory element disposed between the first and second electrodes;
a switching element disposed between the first and second electrodes, the switching element being configured to control signal access to the memory element; and
a barrier layer disposed between the memory element and the switching element,
wherein an electric resistance of the barrier layer in a lengthwise direction and a widthwise direction is greater than an electric resistance of the barrier layer in a thickness direction.

16. A three-dimensional memory device, comprising:
at least one first electrode;
at least one second electrode;
at least one memory layer between the at least one first and second electrodes;
at least one switching device between the at least one first and second electrodes; and
at least one barrier layer between the at least one memory layer and the at least one switching device, the at least one barrier layer including an insulation material and being configured to allow current to flow to the at least one memory layer according to the at least one switching device, an electrical resistance of the at least one barrier layer in a first direction and a second direction being greater than an electrical resistance of the at least one barrier layer in a third direction.

17. The memory device of claim 16, wherein the at least one first electrode, the at least one memory layer, the at least one switching device, and the at least one barrier layer are included in a vertical shell structure.

18. The memory device of claim 17, wherein,
the at least one second electrode includes at least two second electrodes extending in a horizontal direction and disposed on opposite sides of the vertical shell structure.

19. The memory device of claim 16, wherein the at least one barrier layer has a thickness of equal to or less than about 20 Å.

20. A memory device, comprising:
a first electrode;
a second electrode spaced apart from the first electrode;
a memory element disposed between the first electrode and the second electrode;
a switching element disposed between the first electrode and the second electrode, and the switching element being configured to control signal access to the memory element; and
a barrier layer disposed between the memory element and the switching element, the barrier layer including an insulation material, an electric resistance of the barrier layer varying in at least two different directions, wherein the first electrode has a vertical nanopillar structure,
at least one of the memory element and the switching element has a shell structure surrounding the first electrode,
one of the memory element and the switching element is a first element and the other one of the memory element and the switching element is a second element,
the first element is a first shell portion that surrounds the first electrode, the barrier layer is a second shell portion that surrounds the first element, and the second element is a third shell portion that surrounds the barrier layer.

* * * * *